(12) United States Patent
Trester et al.

(10) Patent No.: US 9,741,671 B1
(45) Date of Patent: Aug. 22, 2017

(54) SEMICONDUCTOR DIE WITH BACKSIDE PROTECTION

(71) Applicant: NXP B.V., Eindhoven (NL)

(72) Inventors: Sven Trester, Goessendorf (AT); Claus Grzyb, Hamburg (DE)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/348,728

(22) Filed: Nov. 10, 2016

(51) Int. Cl.
| | |
|---|---|
| *H01L 23/00* | (2006.01) |
| *H01L 23/528* | (2006.01) |
| *H01L 21/02* | (2006.01) |
| *H01L 21/768* | (2006.01) |

(52) U.S. Cl.
CPC ...... *H01L 23/573* (2013.01); *H01L 21/02532* (2013.01); *H01L 21/02595* (2013.01); *H01L 21/76838* (2013.01); *H01L 23/528* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,809,858 B2 * | 8/2014 | Lisart | ...................... | H01L 23/57 257/47 |
| 9,012,911 B2 * | 4/2015 | Wuidart | ................ | H01L 23/576 257/48 |
| 2004/0124524 A1 | 7/2004 | Aumuller et al. | | |
| 2010/0187527 A1 * | 7/2010 | Van Geloven | ........ | H01L 23/576 257/48 |
| 2010/0283456 A1 * | 11/2010 | Zieren | ..................... | H01L 23/57 324/244 |
| 2011/0267094 A1 * | 11/2011 | La Rosa | ............... | G06F 21/552 324/764.01 |
| 2012/0200313 A1 * | 8/2012 | Kyue | ................. | H03K 19/0019 326/8 |
| 2015/0365424 A1 * | 12/2015 | Pelletier | ............... | H04L 9/0625 713/170 |

FOREIGN PATENT DOCUMENTS

WO        2005117115        12/2005

\* cited by examiner

*Primary Examiner* — Mamadou Diallo
(74) *Attorney, Agent, or Firm* — Charles E. Bergere

(57) ABSTRACT

A semiconductor die with backside protection includes an active region and a first polysilicon layer formed on a front side of a semiconductor substrate. A signal net is connected to the first polysilicon layer by way of a metal contact and a conductive wire is formed above the active region. During an invasive attack, when a trench is formed in the substrate and an electrically conductive filling is deposited in the trench, the signal net, the conductive wire, and the first polysilicon shape form a short-circuit, which renders the die dysfunctional and thereby foiling the invasive attack.

20 Claims, 4 Drawing Sheets

SEMICONDUCTOR DIE WITH BACKSIDE PROTECTION

BACKGROUND

The present invention relates generally to semiconductor dies, and more particularly, to a semiconductor die that has protection on its backside against invasive attacks.

A semiconductor die includes electronic circuits formed on a semiconductor substrate. The die also includes power, ground and signal nets that are connected to the circuits to power the circuits and allow the circuits to communicate with each other. These nets are implemented with conductive wires, which usually are metal traces patterned in various layers of the die.

Semiconductor dies may be used in credit cards, debit cards, smart cards, and so on, such that the wires carry confidential data such as an encryption key, a password and the like. Such dies may be subject to tampering in order to illicitly access the confidential data. Such tampering can be in the form of an invasive attack, a semi-invasive attack or a non-invasive attack.

In an invasive attack, physical properties of the semiconductor die are irreversibly modified to retrieve the confidential data. Invasive attacks are commonly referred to as physical attacks. Micro-probing, focused ion beam (FIB), and decapsulating the semiconductor die are a few examples of physical attacks. In a semi-invasive attack, the confidential data is retrieved without making an electrical contact with the semiconductor die. Ultra-violet attacks, optical fault detection and advanced imaging techniques are a few examples of the semi-invasive attacks. In a non-invasive attack, the confidential data is retrieved by altering the operation of the circuitry, typically by manipulating the supply voltage, the clock signal, and the like. Side-channel attacks, brute channel attacks and fault injection attacks are a few examples of the non-invasive attacks.

In a FIB type invasive attack, a trench is formed, using a beam of ions, on the backside of the semiconductor die to access the conductive wires, and layers of metal ions are deposited in the trench. A microprobe is used to establish electrical connections with the wires via the layers of metal ions deposited in the trench. Then confidential data transmitted across the wires may be retrieved using the microprobe.

A known technique to overcome semi-invasive attacks is to insulate the semiconductor die with a shielding layer. In the absence of the shielding layer, when the backside of the semiconductor die is subjected to a semi-invasive attack and exposed to ultra-violet light, an imprint of the circuitry is revealed, which shows the interconnections among the various circuits. In the presence of the shielding layer, when the backside of the semiconductor die is exposed to the ultra-violet light, the shielding layer blocks the ultraviolet light from accessing the circuitry. However, the deposition of an additional shielding layer increases the overall cost of manufacturing the semiconductor die. Further, the shielding layer does not protect the semiconductor die against physical attacks.

Another known technique is to use dummy lines in addition to the conductive wires. Unlike the conductive wires, the dummy lines do not carry critical information. It is difficult for the attacker to distinguish between the dummy lines and the conductive wires. Thus, the dummy lines successfully protect the semiconductor die against optical attacks. However, the dummy lines do not provide any protection against the aforementioned physical attacks.

Therefore, it would be advantageous to have a protection mechanism that does not increase the cost of manufacturing the semiconductor die and that provides protection against physical attacks.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicated similar elements.

DETAILED DESCRIPTION

Figure 1:
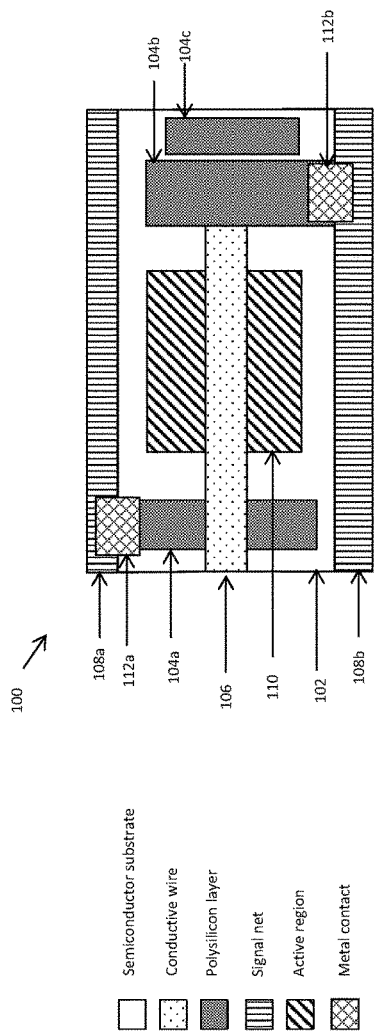
FIG. 1 is a schematic layout diagram of a semiconductor die in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention is a semiconductor die including an active region, a first polysilicon shape, a signal net, and a conductive wire. The active region is formed on a front side of a semiconductor substrate. The semiconductor substrate has a backside that is opposite to the front side. The first polysilicon shape is formed on the front side of the semiconductor substrate and is deposited adjacent to the active region. The signal net is connected to the first polysilicon shape by way of a first metal contact. The conductive wire is formed above the active region. When a trench is formed in the backside of the semiconductor substrate and an electrically conductive filling is deposited in the trench, the signal net, the conductive wire, and the first polysilicon shape form a short-circuit. Thus, the semiconductor die is rendered dysfunctional.

In another embodiment, the present invention is a semiconductor die including an active region, a first polysilicon shape, a checked net, and a conductive wire. The active region is formed on a front side of a semiconductor substrate. The semiconductor substrate has a backside that is opposite to the front side. The first polysilicon shape is formed on the front side of the semiconductor substrate and is disposed adjacent to the active region. The checked net is connected to the first polysilicon shape by way of at least one first metal contact. The checked net transmits a signal pattern. The conductive wire is formed above the active region. When a trench is formed in the semiconductor substrate, an open-circuit is formed and an error is detected in the signal pattern. Furthermore, when an electrically conductive filling is deposited in the trench, the checked net, the conductive wire, and the first polysilicon shape form a short-circuit. Thus the semiconductor die is rendered dysfunctional.

In yet another embodiment, the present invention provides a method of securing data within a semiconductor die. The method includes forming an active region on a semiconductor substrate. The semiconductor substrate has a backside that is opposite to the front side. The method includes forming a first polysilicon shape on the front side of the substrate. The first polysilicon shape is disposed adjacent to the active region. The method further includes connecting the first polysilicon shape to a signal net by way of at least one first metal contact. The method further includes forming a conductive wire above the active region. When a trench is formed and an electrically conductive filling is deposited in the trench, the signal net, the conductive wire, and the first polysilicon shape form a short-circuit, which renders the die dysfunctional.

Various embodiments of the present invention provide a semiconductor die. The semiconductor die is a secure chip that may be used in credit cards, debit cards, smart cards, and the like. In designing the die (physical layout), it is known to fill some areas with floating polysilicon shapes. In one embodiment of the invention, these floating polysilicon shapes are enlarged and then connected to signal nets (i.e., power, ground or signal lines). Enlarging these floating poly shapes leaves less space for a probe attack, and connecting these floating poly shapes to signal nets allows for detection if the shape is compromised such as by an illicit probe. Put another way, the semiconductor die includes an active region, a first polysilicon layer, a signal net, and a conductive wire. The active region is formed on a front side of a semiconductor substrate. Interconnections between active regions form electronic circuits. These circuits are connected to each other with conductive wires, which transmit confidential data to/from the circuits. The first polysilicon layer is formed on the front side of the semiconductor substrate and is disposed adjacent to the active region. The signal net is connected to the first polysilicon layer by way of a first metal contact. The conductive wire is formed above the active region. When a trench is formed in the semiconductor substrate and an electrically conductive filling is deposited in the trench, the signal net, the conductive wire, and the first polysilicon layer form a short-circuit, which renders the die dysfunctional such that confidential data cannot be retrieved from the die nor correctly transmitted over the conductive wire. Further, the fabrication of the semiconductor die does not require the deposition of additional semiconductor material so there is no additional cost involved in the manufacturing of the semiconductor die.

Referring now to FIG. 1, a schematic layout of a front side of a semiconductor die 100 in accordance with an embodiment of the present invention is shown. The semiconductor die 100 is a secure chip that may be used in credit cards and smart cards, and also in other applications that require secure storage and exchange of information. The semiconductor die 100 includes memory cells or registers that are used to store confidential data such as encryption keys, passwords and the like. Thus, the semiconductor die may be subject to illicit, invasive attacks to retrieve the confidential data. In order to hinder such attacks, floating polysilicon shapes are enlarged and connected to signal nets so that probing the backside of the die will interfere with the signal nets causing opens and shorts that will render the die dysfunctional so that such secure data cannot be retrieved from the die.

Referring again to FIG. 1, the die 100 includes a semiconductor substrate 102, first through third polysilicon shapes or layers 104a-104c (collectively referred to as polysilicon shapes 104), a conductive wire 106, first and second signal nets 108a and 108b (collectively referred to as signal nets 108), an active region 110, and first and second metal contacts 112a and 112b (collectively referred to as metal contacts 112).

The polysilicon shapes 104, the conductive wire 106, the signal nets 108, the active region 110, and the metal contacts 112 are formed above the semiconductor substrate 102 using processes understood by those of skill in the art. The first polysilicon shape 104a is formed by stretching a floating polysilicon layer. The first polysilicon shape 104a then is connected to the first signal net 108a by way of the first metal contact 112a. The second polysilicon shape 104b is formed by stretching a floating polysilicon layer, and the stretched layer then is connected to the second signal net 108b by way of the second metal contact 112b. The third polysilicon shape 104c is a floating polysilicon shape. The conductive wire 106 is formed above the active region 110 and carries multiple critical signals. Examples of the critical signals include select signals, data signals and the like. The semiconductor die 100 may be subject to an invasive attack to obtain the data being transmitted over the signal nets.

During an invasive attack, a trench is formed in the semiconductor substrate 102 on a backside of the semiconductor die 100. Then to retrieve the confidential data, an electrically conductive filling is deposited in the trench. When the conductive filling is deposited, the at least one of the first and second signal nets 108a and 108b, the conductive wire 106, and the at least one of the first and second polysilicon shapes 104a and 104b will form a short-circuit, which will render the die 100 dysfunctional, and hence, the confidential data will not be able to be retrieved from the semiconductor die 100.

The invasive attack may comprise a FIB type attack, where the trench is formed using a FIB in which a beam of ions is used to both form the trench and deposit the metal ions (the electrically conductive filling) in the trench.

The first and second signal nets 108a and 108b each may be at least one of a shielding net, a checked net, and a power supply net. A shielding net is a net with implemented measures to check if the net is broken, e.g., extra nets that are added to the functional nets for security purposes. A checked net is a functional net with added measures to sense manipulations on the net, for example, by doubling a circuit or inverting a signal and then comparing it the nets still deliver the correct expected result. In one embodiment, the first and second signal nets 108a and 108b are the first and second power supply nets 108a and 108b, respectively. In an example, the first power supply net 108a is at a positive voltage level and the second power supply net 108b is ground. During an invasive attack a trench is formed from the backside of the semiconductor substrate 102. When the conductive filling is deposited in the trench, the first power supply net 108a, the first polysilicon shape 104a, and the conductive wire 106 form a short-circuit, which renders the die 100 dysfunctional. In another example, the trench is formed on the right-hand side (RHS) of the active region 110. When the electrically conductive filling is deposited in the trench, the second power supply net 108b, the second polysilicon shape 104b, and the conductive wire 106 form a short-circuit, rendering the semiconductor die 100 dysfunctional.

Figure 2:
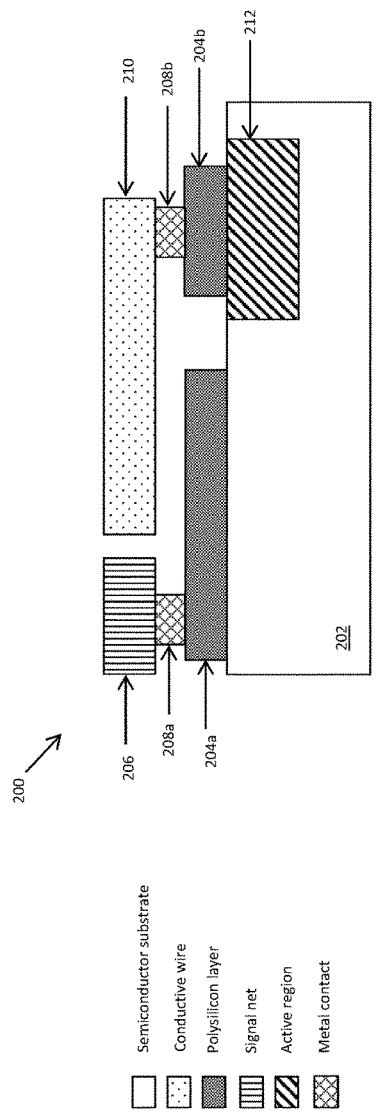
FIG. 2 is a sectional side view of a semiconductor die in accordance with another embodiment of the present invention.

Referring now to FIG. 2, a sectional side view of a semiconductor die 200 in accordance with another embodiment of the present invention is shown. The die 200 includes a semiconductor substrate 202, first and second polysilicon shapes 204a and 204b (collectively referred to as polysilicon shapes 204), a signal net 206, first and second metal contacts 208a and 208b (collectively referred to as metal contacts 208), a conductive wire 210 and, an active region 212.

The polysilicon shapes 204, the signal net 206, the metal contacts 208, the conductive wire 210 and the active region 212 are formed above the semiconductor substrate 202. The first polysilicon shape 204a is connected to the signal net 206 by way of the first metal contact 208a. The second polysilicon shape 204b is overlaid on the active region 212. The conductive wire 210 is connected to the second polysilicon shape 204b by way of the second metal contact 208b. The conductive wire 210 is formed above the active region 212 and carries the aforementioned multiple critical signals.

During an invasive attack, a trench is formed in the semiconductor substrate 202 on a backside of the semiconductor die 200, and to retrieve the confidential data, an electrically conductive filling is deposited in the trench. When the conductive filling is deposited, the signal net 206, the conductive wire 210, and the first polysilicon shape 204a will form a short-circuit, which renders the die 200 dysfunctional such that confidential data cannot be retrieved from the die 200.

The signal net 206 may be at least one of a shielding net, a checked net, and a power supply net. In one embodiment, the signal net 206 is the power supply net. During an invasive attack a trench is formed in the semiconductor substrate 202. When the electrically conductive filling is deposited in the trench, the power supply net 206, the first polysilicon shape 204a, and the conductive wire 210 form a short-circuit, rendering the semiconductor die 200 dysfunctional.

Figure 3A:
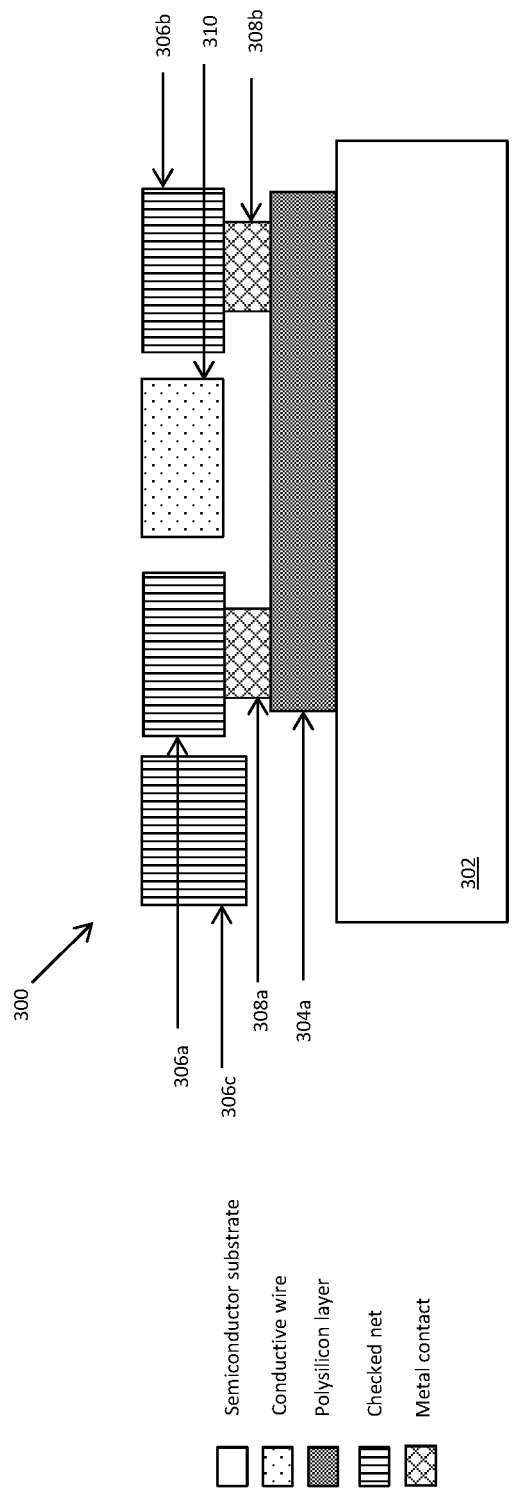
FIG. 3A is a sectional side view of a semiconductor die in accordance with another embodiment of the present invention.

Referring now to FIG. 3A, a sectional side view of a semiconductor die 300 in accordance with another embodiment of the present invention is shown. The die 300 includes a semiconductor substrate 302, a polysilicon shape 304a, first and second checked net branches 306a and 306b that constitute a first checked net 306a-306b, a second checked net 306c (collectively referred to as checked nets 306), first and second metal contacts 308a and 308b (collectively referred to as metal contacts 308), and a conductive wire 310.

Figure 3B:
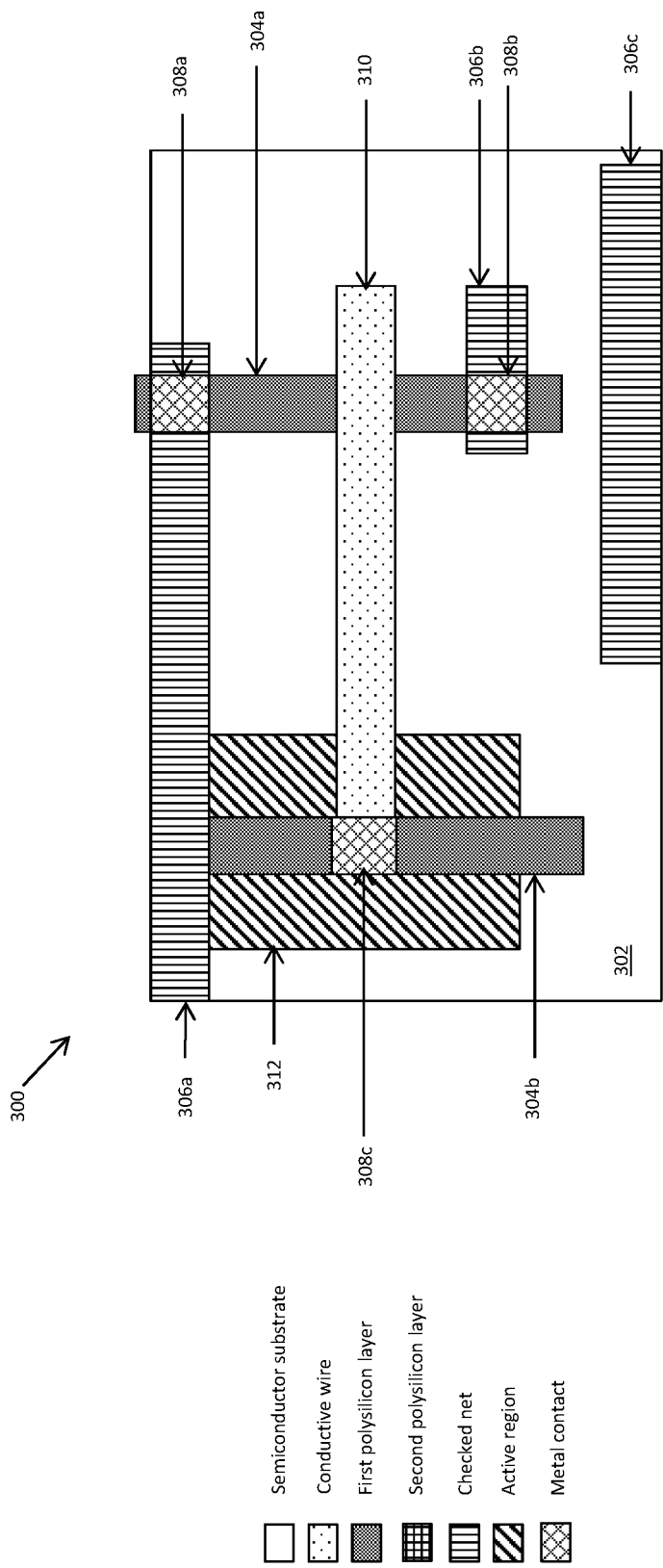
FIG. 3B is a top view of the semiconductor die of FIG. 3A.

FIG. 3B is a top view of the semiconductor die 300. The die 300 further includes a second polysilicon shape 304b, a third metal contact 308c, and an active region 312.

The polysilicon shapes 304, the checked nets 306, the metal contacts 308, the conductive wire 310 and the active region 312 are formed above the semiconductor substrate 302. The first polysilicon shape 304a is connected to the first checked net branch 306a by way of the first metal contact 308a. The first polysilicon shape 304a is connected to the second checked net branch 306b by way of the second metal contact 308b. The conductive wire 310 is connected to the second polysilicon shape 304b by way of the third metal contact 308c. The conductive wire 310 is formed above the active region 312 and carries the aforementioned multiple critical signals.

The checked nets 306 carry multiple signal patterns. The signal patterns may be generated by a random signal generator (not shown), a counter, or a finite state machine (FSM). In one embodiment, the random signal generator generates the signal patterns. The first checked net 306a-306b carries a first signal pattern and the second checked net 306c carries a second signal pattern. A comparator (not shown) is connected to the first and second checked nets 306a-306b and 306c, and receives and compares the first and second signal patterns. In one embodiment, the first and second checked nets 306a-306b and 306c both carry the same signal pattern i.e. the first and second signal patterns are same. When the comparator determines that there is a match between the first and second signal patterns, it is determined that the checked nets 306 are functioning correctly. During an invasive attack, when a trench is formed in the die 300, the first checked net branch 306a will be distorted. As a result, the comparator will detect a mismatch between the first and second signal patterns carried by the first and second checked nets 306a-306b and 306c, respectively. A mismatch is indicative of an invasive attack so detection of a mismatch by the comparator is used to indicate that an attack is occurring.

In another embodiment, the first checked net 306a-306b carries a signal pattern and the second checked net 306c carries an inverted version of the signal pattern. Thus, the comparator checks whether the signal pattern of the first checked net is an inverted inversion of the signal pattern transmitted by the second checked net. During an invasive attack, when a trench is formed in the semiconductor die 300, the second checked net 306c will be distorted. As a result, the comparator will determine that the signal pattern of the second checked net 306c is not the inverted version of the signal pattern of the first checked net 306a-306b. Thus, an error in the signal pattern of the second checked net 306c is detected. Hence, the comparator module detects the invasive attack on the semiconductor die 300.

To retrieve the confidential data during the invasive attack, an electrically conductive filling is deposited in the trench. When the conductive filling is deposited, the at least one of the first and second checked nets 306a and 306b, the conductive wire 310, and the polysilicon shape 304 form a short-circuit. Thus, the semiconductor die 300 is rendered dysfunctional and hence, the confidential data cannot be retrieved from the die 300.

Figure 4:
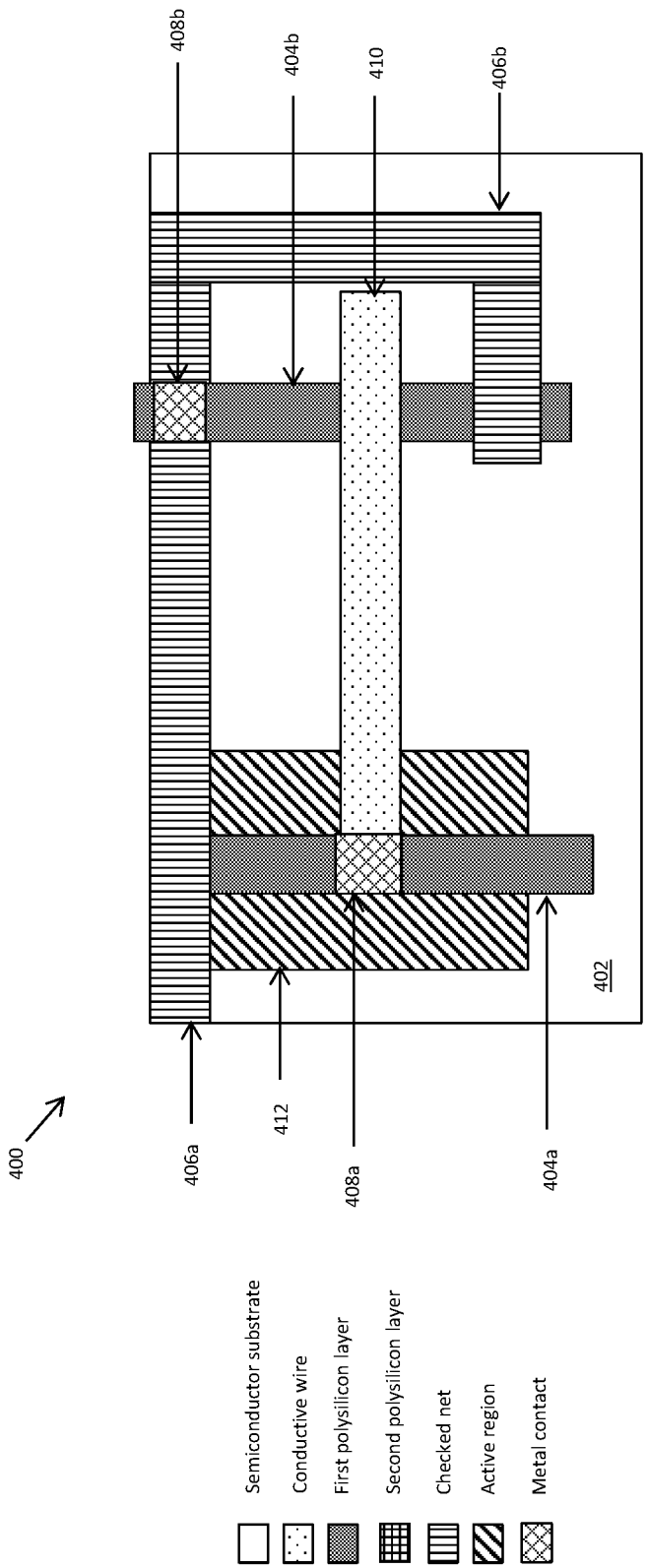
FIG. 4 is a top view of a semiconductor die in accordance with another embodiment of the present invention.

Referring now to FIG. 4, a top view of a semiconductor die 400 in accordance with another embodiment of the present invention is shown. The semiconductor die 400 includes a semiconductor substrate 402, first and second polysilicon shapes 404a and 404b (collectively referred to as polysilicon shapes 404), first and second signal net branches 406a and 406b that constitute a signal net 406, first and second metal contacts 408a and 408b (collectively referred to as metal contacts 408), a conductive wire 410, and an active region 412.

The polysilicon shapes 404, the signal net 406, the metal contacts 408, the conductive wire 410 and the active region 412 are formed above the semiconductor substrate 402. The conductive wire 410 is connected to the first polysilicon shape 404a by way of the first metal contact 408a. The conductive wire 410 is formed above the active region 412 and carries multiple critical signals. The first polysilicon shape 404a is formed on the active region 412. The first signal net branch 406a is connected to the second polysilicon shape 404b by way of the second metal contact 408b.

The signal net 406 carries a signal pattern. In one embodiment, the first signal net branch 406a is connected to a random signal generator for receiving the signal pattern. Further, the second signal net branch 406b is connected to a comparator. When the comparator receives the same signal pattern as that carried by the first signal net branch 406a, it is determined that the semiconductor die 400 is functioning correctly. If there is an invasive attack in which a trench is formed in the substrate 402, the first signal net branch 406a will be distorted. As a result, the comparator will receive an incorrect signal pattern from the second signal net branch 406b. The incorrect signal pattern indicates that there is an error in the functioning of the die 400. Hence, the comparator module detects the invasive attack on the semiconductor die 400.

To retrieve confidential data during the invasive attack, a trench is formed in the semiconductor substrate 402 on a backside of the semiconductor die 400, and an electrically conductive filling is deposited in the trench. When the conductive filling is deposited, the at least one of the first and second signal net branches 406a and 406b, the conductive wire 410, and the second polysilicon shape 404b form a short-circuit. Thus, the semiconductor die 400 is rendered dysfunctional and the confidential data cannot be retrieved from the semiconductor die 400 so the attack will be unsuccessful.

Typically, in the semiconductor die 400 a few of the signal net branches are critical net branches and the rest are noncritical net branches. In one embodiment, the first and second signal net branches 406a and 406b are first and second noncritical net branches (hereinafter referred to as first noncritical net branch 406a and second noncritical net branch 406b), respectively. The signal net 406 (hereinafter referred to as noncritical net 406) do not carry security critical signal patterns of the semiconductor die 400. For example, the noncritical net 406 may be input/output (IO) net branches, where the noncritical net 406 transmits an incorrect signal pattern due to distortion caused by an invasive attack. To perform an attack, a trench is formed in the backside of the semiconductor substrate 402 and an electrically conductive filling is deposited in the trench, which will cause the first noncritical net branch 406a, the first polysilicon shape 404a, and the conductive wire 410 to form a short-circuit. In another example, the trench is formed on the right-hand side (RHS) of the active region 412, and the electrically conductive filling is deposited in the trench, Then the second noncritical net branch 406b, the second polysilicon shape 404b, and the conductive wire 410 will form a short-circuit. These short-circuits will render the die 400 dysfunctional, which will hinder the invasive attack.

The semiconductor die is rendered dysfunctional during a physical attack on the die by creating a short-circuit across the conductive wire, the polysilicon shape, and the signal nets. Thus, the existing layers including the floating polysilicon layers, the conductive wires and the signal nets of the semiconductor die are used to protect the semiconductor die. Further, there is no deposition of an additional shielding layer required to protect the semiconductor die against physical attacks.

In this application, the term "conductive wire" can refer to a wire or a conductive trace formed in a metal layer of a semiconductor die. In the claims, the words 'comprising', 'including' and 'having' do not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:
1. A semiconductor die, comprising:
an active region formed on a front side of a semiconductor substrate, wherein the semiconductor substrate has a backside that is opposite to the front side;
a first polysilicon shape formed on the front side of the semiconductor substrate, wherein the first polysilicon shape is disposed adjacent to the active region;
a signal net connected to the first polysilicon shape by way of a first metal contact; and
a conductive wire formed above the active region,
wherein when a trench is formed in the backside of the semiconductor substrate and an electrically conductive filling is deposited in the trench, the signal net, the conductive wire, and the first polysilicon shape form a short-circuit, thereby rendering the semiconductor die dysfunctional.

2. The semiconductor die of claim 1, wherein the signal net comprises at least one of a shielding net, a checked net, and a power supply net.

3. The semiconductor die of claim 2, wherein the power supply net is at least one of a positive voltage level and ground.

4. The semiconductor die of claim 1, wherein a second polysilicon shape is formed on the active region.

5. The semiconductor die of claim 4, wherein the conductive wire is connected to the second polysilicon shape by way of a second metal contact.

6. The semiconductor die of claim 4, wherein the second polysilicon shape is a functional polysilicon shape.

7. A semiconductor die, comprising:
an active region formed on a front side of a semiconductor substrate, wherein the semiconductor substrate has a backside that is opposite to the front side;
a first polysilicon shape formed on the front side of the semiconductor substrate, wherein the first polysilicon shape is disposed adjacent to the active region;
a checked net connected to the first polysilicon shape by way of at least one first metal contact, wherein the checked net comprises a signal net that transmits a signal pattern; and
a conductive wire formed above the active region,
wherein when a trench is formed in the semiconductor substrate, an open-circuit is formed and an error is detected in the signal pattern, and when an electrically conductive filling is deposited in the trench, the checked net, the conductive wire, and the first polysilicon shape form a short-circuit, thereby rendering the semiconductor die dysfunctional.

8. The semiconductor die of claim 7, wherein a second polysilicon shape is formed on the active region.

9. The semiconductor die of claim 8, wherein the conductive wire is connected to the second polysilicon shape by way of a second metal contact.

10. The semiconductor die of claim 8, wherein the second polysilicon shape is a functional polysilicon layer.

11. A method of fabricating a semiconductor die that includes protection against backside invasive attacks, the method comprising:
- forming an active region on a front side of a semiconductor substrate, wherein the semiconductor substrate has a backside that is opposite to the front side;
- forming a first polysilicon shape by stretching a floating polysilicon layer on the front side of the semiconductor substrate, wherein the first polysilicon shape is disposed adjacent to the active region;
- connecting the first polysilicon shape to a signal net by way of at least one first metal contact; and
- forming a conductive wire above the active region,
- wherein when a trench is formed and an electrically conductive filling is deposited in the trench, the signal net, the conductive wire, and the first polysilicon shape form a short-circuit, thereby rendering the semiconductor die dysfunctional.

12. The method of claim 11, wherein the signal net is a checked net, and wherein the signal net transmits a signal pattern.

13. The method of claim 12, wherein when the trench is formed in the semiconductor substrate, an open-circuit is formed and an error is detected in the signal pattern.

14. The method of claim 11, wherein the signal net is a noncritical net, and wherein the noncritical net transmits a signal pattern.

15. The method of claim 14, wherein when the trench is formed in the semiconductor substrate, an open-circuit is formed, and the signal pattern is transmitted incorrectly.

16. The method of claim 14, wherein when the electrically conductive filling is deposited in the trench, the noncritical net, the conductive wire, and the first polysilicon shape form the short-circuit, thereby rendering the semiconductor die dysfunctional.

17. The method of claim 11, wherein the signal net comprises at least one of a shielding net and a power supply net.

18. The method of claim 17, wherein the power supply net is at least one of a positive voltage level and ground.

19. The method of claim 11, wherein a second polysilicon shape is formed on the active region, and wherein the conductive wire is connected to the second polysilicon layer by way of a second metal contact.

20. The method of claim 19, wherein the second polysilicon shape is a functional polysilicon layer.

* * * * *